United States Patent
Ray

[11] Patent Number: 6,147,349
[45] Date of Patent: Nov. 14, 2000

[54] METHOD FOR FABRICATING A SELF-FOCUSING DETECTOR PIXEL AND AN ARRAY FABRICATED IN ACCORDANCE WITH THE METHOD

[75] Inventor: Michael Ray, Goleta, Calif.

[73] Assignee: Raytheon Company, Lexington, Mass.

[21] Appl. No.: 09/127,327

[22] Filed: Jul. 31, 1998

[51] Int. Cl.[7] ................... H01L 31/0232; H01L 31/0352
[52] U.S. Cl. ................ 250/338.4; 257/436; 257/626; 438/73
[58] Field of Search ........................ 250/338.4; 438/73, 438/57; 257/428, 431, 436, 442, 443, 622, 623, 626, 447, 466

[56] References Cited

U.S. PATENT DOCUMENTS

| | | | |
|---|---|---|---|
| 4,183,035 | 1/1980 | Wang et al. | 257/188 |
| 4,794,439 | 12/1988 | Webb et al. | 257/12 |
| 5,113,076 | 5/1992 | Schulte . | |
| 5,149,956 | 9/1992 | Norton . | |
| 5,239,179 | 8/1993 | Baker . | |
| 5,380,669 | 1/1995 | Norton . | |
| 5,422,475 | 6/1995 | Norton . | |
| 5,581,084 | 12/1996 | Chapman et al. . | |
| 5,721,429 | 2/1998 | Radford et al. . | |

OTHER PUBLICATIONS

Some Properties Of Photovoltaic $Cd_xHg_{1-x}Te$ Detectors For Infrared Radiation*, J.M. Pawlikowski et al., Jan. 8, 1975, 7 pages.

*Primary Examiner*—Constantine Hannaher
*Assistant Examiner*—Albert Gagliardi
*Attorney, Agent, or Firm*—William C. Schubert; Glenn H. Lenzen, Jr.

[57] ABSTRACT

Disclosed is a method for fabricating an array of electromagnetic radiation responsive photodiodes, and an array fabricated in accordance with the method. The method includes steps of (a) providing a transparent substrate (12); (b) growing on the substrate an electrically conductive buffer layer (14), an n-type radiation absorbing layer (16), and a p-type cap layer (18) forming a p-n junction; and (c) etching first trenches through the cap layer, the radiation absorbing layer, and partially through the buffer layer for forming initial mesa structures each having a top surface, a base, and sloping sidewalls that terminate in the buffer layer. The method further (d) forms a passivating layer (22) on the sloping side walls; (e) forms an electrical contact (24) that surrounds the bases of the initial mesa structures and that makes an ohmic contact with a surrounding portion of the buffer layer; and (f) etches a plurality of second trenches through exposed portions of the buffer layer and into the substrate. The second trenches delineate a plurality of larger mesa structures each of which supports one of the initial mesa structures. A common layer of metalization (30) is applied to exposed surfaces of the second trenches and is coupled to each of the electrical contacts. Each of the larger mesa structures has sloping side walls disposed at an angle for supporting internal reflection of radiation that is incident on the substrate, thereby concentrating the incident radiation into the radiation absorbing layer.

17 Claims, 2 Drawing Sheets

METHOD FOR FABRICATING A SELF-FOCUSING DETECTOR PIXEL AND AN ARRAY FABRICATED IN ACCORDANCE WITH THE METHOD

FIELD OF THE INVENTION

This invention relates generally to detectors of electromagnetic radiation and, in particular, to methods for fabricating mesa-type arrays of Group II-VI alloy semiconductor photodetectors that are responsive to infrared (IR) radiation.

BACKGROUND OF THE INVENTION

In mesa-type arrays of Group II-VI alloy semiconductor photodetectors a multilayered structure is first patterned and then etched to form a plurality of optically differentiated radiation photodetector sites or pixels. For a photovoltaic type of detector each optically differentiated pixel is comprised of portions of at least two layers of Group II-VI material that are contained within at least one mesa structure. The mesa has sloping sidewalls and exemplary dimensions for a base portion of 60 micrometers square and a height of five micrometers. At least two layers have different types of electrical conductivities (e.g., one layer is p-type and the other is n-type). The resulting p-n or n-p, heterojunction is reverse biased during use for collecting and reading out charge carriers (electrons or holes) that result from the absorption of IR radiation within at least one of the layers. For a backside illuminated array, the IR radiation is made to be incident upon a surface of a transparent substrate that is opposite to a surface that supports the mesa structures. The IR radiation passes through the substrate and into the radiation absorbing layer within a given mesa.

As the volume of the radiation absorbing layer within each mesa is made larger the collection efficiency of the photodetector can be increased, as there is a greater probability that a photon will be collected and absorbed. However, an increase in the volume of the radiation absorbing layer also results in a tendency towards increased thermal noise generation and other undesirable effects. More particularly, both the signal (photocurrent) and the leakage or dark current are proportional to pixel area. However, the noise is equal to the square root of the dark current. Therefore, the signal/noise ratio increases as the square root of the area as the area increases.

It can thus be appreciated that it is desirable to satisfy two conflicting goals, i.e., to maximize the collection efficiency of each photodetector, while at the same time minimizing a volume of the radiation absorbing layer.

It is known to employ a microlens element with each photodetector pixel to focus the incident radiation into a smaller collection volume. However, the fabrication of such microlenses is difficult, and often may not present a practical approach to improving the detector performance.

U.S. Pat. No. 5,721,429, issued Feb. 24, 1998, entitled "Self-Focusing Detector Pixel Structure Having Improved Sensitivity", by William Radford and Jerry A. Wilson teaches an array of mesa-type photodetectors that are constructed to provide for an internal reflection of incident electromagnetic radiation into a collection volume of the photodetector, thereby increasing the collection efficiency of each photodetector, while at the same time enabling a reduction in the volume of the radiation absorbing region of each photodetector.

OBJECTS OF THE INVENTION

It is an object of this invention to teach a method for fabricating a photodetector, as well as a photodetector fabricated in accordance with the method, that provides improvements and enhancements to the teachings of the above-referenced U.S. Pat. No. 5,721,429.

It is another object of this invention to provide a method for fabricating an array of photodetectors so as to maximize the collection efficiency of each photodetector, while at the same time minimizing a volume of the radiation absorbing region of each photodetector.

It is a further object of this invention to provide a method for fabricating an array of mesa-type photodetectors having sidewalls that are disposed at angle suitable for providing for a total internal reflection of incident electromagnetic radiation and a consequent focusing of the radiation into a collection volume of the photodetector.

It is one further object of this invention to provide a method for fabricating an array of mesa-type photodetectors having sidewalls that are coated with a reflective material for reflecting incident electromagnetic radiation and a consequent focussing of the radiation into a collection volume of the photodetector, wherein the reflective material also functions as a common electrical contact to each of the photodetectors.

SUMMARY OF THE INVENTION

The foregoing and other problems are overcome and the objects of the invention are realized by methods and apparatus in accordance with embodiments of this invention.

The fabrication of specular, flat, sloped mesa sidewalls is preferably accomplished by an anisotropic process such as a reactive ion etch process, as opposed to the conventional wet chemical etch that typically results in curved sidewalls, due to isotropic action, that are not suitable for supporting internal reflection.

In a presently preferred embodiment of this invention a method is provided to fabricate an array of photodetectors that are comprised of IR radiation-responsive Group II-VI alloy semiconductor material, such as HgCdTe. The array is fabricated using a deep trench etching process in combination with selective metalization such that a self-focussing effect increases the sensitivity of the photodetectors and reduces cross-talk between the photodetectors. Signal crosstalk between photodetectors is reduced or eliminated since the IR radiation absorbing regions are fully delineated and isolated from one another by deep trenches that define the mesa sidewalls. Thus, the diffusion of optically generated carriers from one photodetector to an adjacent photodetector is prevented.

A method for fabricating an array of electromagnetic radiation responsive photodiodes in accordance with the teaching of this invention includes the steps of (a) providing a substrate that is substantially transparent to wavelengths within a range of wavelengths of interest; (b) growing a plurality of layers upon a first surface of the substrate that is opposite to a second, radiation receiving surface of the substrate, the plurality of layers including an electrically conductive buffer layer, a radiation absorbing layer having a first type of conductivity, and a cap layer having a second type of conductivity opposite the conductivity of the radiation absorbing layer for forming a p-n junction therewith; and (c) etching, using a wet chemical etch, a plurality of first orthogonally disposed trenches through the cap layer, through the radiation absorbing layer, and partially through the buffer layer for differentiating the radiation absorbing layer and the cap layer into a plurality of initial mesa structures each having a base, a top surface, and sloping sidewalls that extend from the top surface to the base that terminates in the buffer layer. The method further includes the steps of (d) forming a passivating layer on the sloping side walls; (e) forming an electrical contact that surrounds the base of each of the initial mesa structures, the electrical contact partially overlapping the passivating layer and forming an ohmic contact with a surrounding portion of the buffer layer; and (f) etching, using a reactive ion etch, a plurality of second orthogonally disposed trenches through exposed portions of the buffer layer and into the substrate for electrically isolating each of the initial mesa structures one from the other. The second orthogonally disposed trenches delineate a plurality of larger mesa structures individual ones of which support one of the initial mesa structures. The method further includes a step of (g) applying a common layer of metalization to exposed surfaces of the second orthogonally disposed trenches. The common layer of metalization is conductively coupled to each of the electrical contacts that surround the base of each of the initial mesa structures.

Each of the larger mesa structures has sloping side walls disposed at an angle (e.g., about 20 degrees) for supporting internal reflection of electromagnetic radiation that is incident on the radiation receiving surface of the substrate.

In the preferred embodiment of this invention at least the buffer layer, the radiation absorbing layer, and the cap layer are each comprised of a Group II-VI alloy semiconductor material, and the radiation absorbing layer is responsive to IR radiation.

For a case where the initial mesa structures have a center to center spacing of x microns one from the other, the depth of the second trenches is approximately 0.65x microns.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
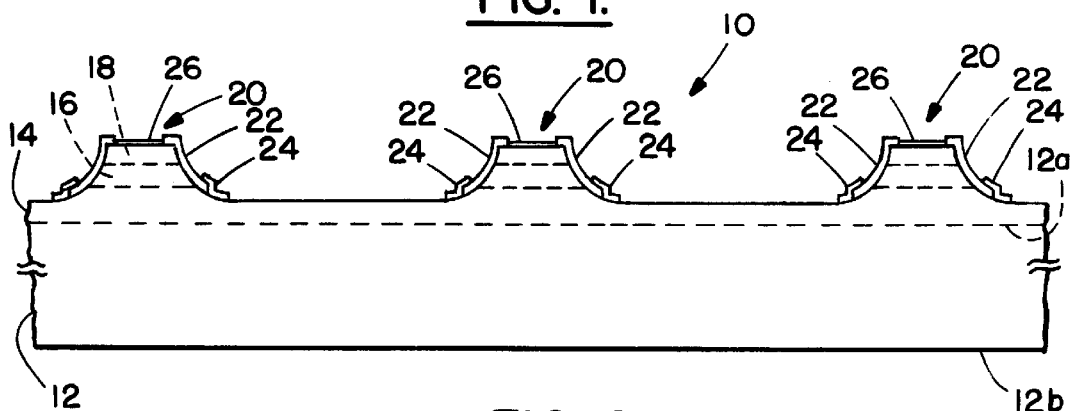
FIG. 1 is an enlarged cross-sectional view of a portion of an array of photodetectors showing first processing steps in accordance with this invention.
Figure 2:
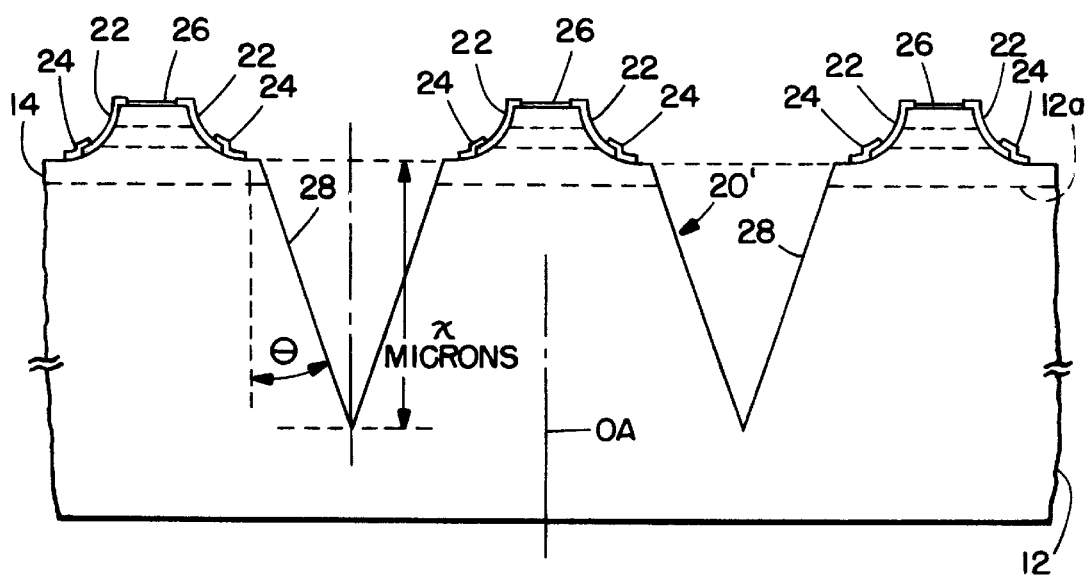
FIG. 2 is an enlarged cross-sectional view of the portion of the array of photodetectors showing intermediate processing steps in accordance with this invention.
Figure 3:
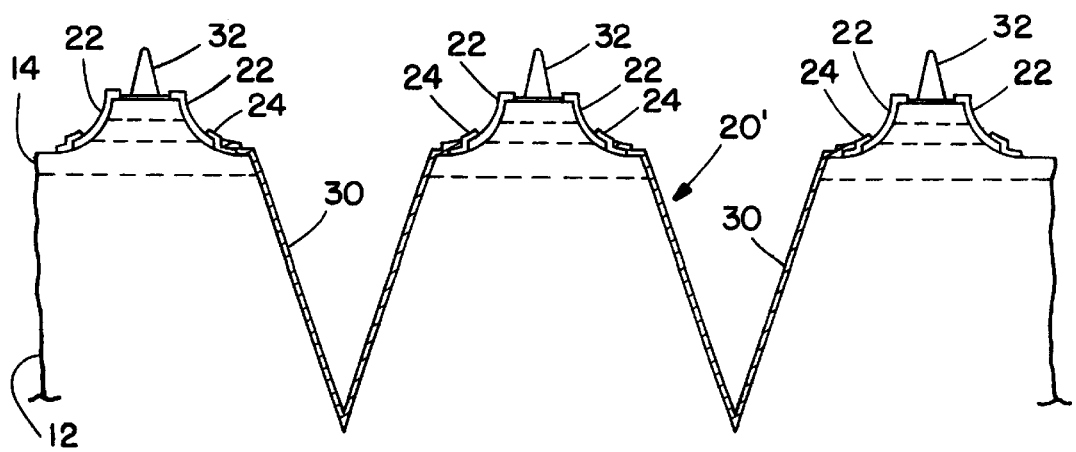
FIG. 3 is an enlarged cross-sectional view of the portion of the array of photodetectors showing final processing steps in accordance with this invention.

Reference is made to FIGS. 1, 2 and 3 for illustrating a presently preferred process for fabricating a reduced area photodetector and an array of same, wherein mesa structures are shaped so as to concentrate incident radiation into an active area. Processing starts with a transparent insulating substrate 12 that has an electrically conductive buffer layer 14 formed on a major surface 12*a*. The buffer layer 14 has a thickness of about five microns. An opposite surface 12*b* of the substrate is a radiation admitting surface for IR photons. Over the buffer layer 14 is formed an n-type radiation absorbing layer 16. On top of the layer 16 is grown an oppositely doped capping layer 18 which forms a p-n heterojunction with the layer 16.

Next, a plurality of initial mesa structures 20 are formed by patterning and then etching through the layers 18 and 16, and partially into the buffer layer 14. A suitable etching process is a wet Bromine-Ethylene-Glycol etch. In the illustrated example the center to center spacing or pitch of the initial mesa structures 20 is 60 microns, although other spacings could be employed. After forming the initial mesa structures 20 a layer 22 of passivation, such as a layer of wider bandgap semiconductor material, is selectively applied to exposed side wall surfaces of the mesa structures 20.

After applying the passivation layer 22 a layer of contact metal 26 (e.g., 1000 to 2000 Angstroms thick gold) is applied to the p-type cap layer of each initial mesa structure 20, and a common contact layer 24 (also 1000 to 2000 Angstroms thick) is applied such that it encircles the base portion of each initial mesa structure 20. The common contact layer 24 that encircles each initial mesa structure 20 partially overlaps the passivation layer 22, and partially rests on the surface of the surrounding buffer layer 14 for forming an ohmic contact with the buffer layer 14. The common contact layers 24 are thus not placed on the steep mesa side walls, but are instead located on the more planar base portion of the mesa structure. A suitable width of each common contact layer 24 is about four microns, for the exemplary embodiment of mesa structures having a 60 micron pitch. FIG. 1 illustrates the array at this stage of the processing.

Referring now to FIG. 2, the initial mesa structures 20 and contact metalization 24 are masked and a second etch, preferably a reactive ion etch, is then performed so as to form a plurality of orthogonally disposed trenches 28 which extend completely through the layers 18, 16, and 14, and into the substrate 12. The trenches 28 define a plurality of steep-walled mesa structures 20'. FIG. 2 shows a first mesa structure 20' and portions of two adjacent mesa structures. For the illustrated example the depth of each trench 28 is about 40 microns, and the mesa side wall angle Q is about 20 degrees, both of which are referenced to the surface of the buffer layer 14. Each of the mesa structures 20' thus supports one of the initial mesa structures 20 and is optically coupled thereto for incident IR radiation that impinges on the substrate surface 12*b* along or within a cone that includes an optical axis (OA).

The trenches 28 are preferably formed so as to provide substantially flat and specular mesa side walls that are capable of supporting internal reflections for the incident photons, leading to a concentration of the photons into the radiation absorbing layer 16.

Referring now to FIG. 3, the initial mesa structures 20 and contact metalization 24 is again masked and a layer of common interconnect contact metal 30 (e.g., 1000 to 2000 Angstroms thick) is applied such that the common contact layer 24 that surrounds each initial mesa 20 is conductively connected to the common contact layer 24 surrounding every other mesa. This serves to electrically connect together the n-type layers 16 of every initial mesa structure 20. The metalization layer 30 is preferably applied by a lift-off process such that the initial mesa structures are covered by a layer of resist, as well as a portion of the contact layers 24, and the metal is blanket deposited such that it overlays the exposed portions of the contact metal 24. The resist is then removed, taking with it any adhering metal. Sputtering and evaporation are two suitable techniques for depositing the metalization layer 30.

The metalization 30, in addition to serving as a common contact layer, may also function to reflect incident radiation within the mesa structure 20' such that photons are directed or concentrated into the n-type radiation absorbing layer 16, thereby improving the collection efficiency of the photodetector. Gold-nickel is one suitable metal system for forming the metalization layer 30, which can be applied to the mesa structures 20' by evaporation or sputtering after they have been suitably masked to cover the top of each mesa. Interconnects 32, such as Indium bumps, may also be applied for subsequently connecting the p-n junction within each mesa structure 20' to a readout integrated circuit (not shown) through a well-known cold weld process.

Figure 4:
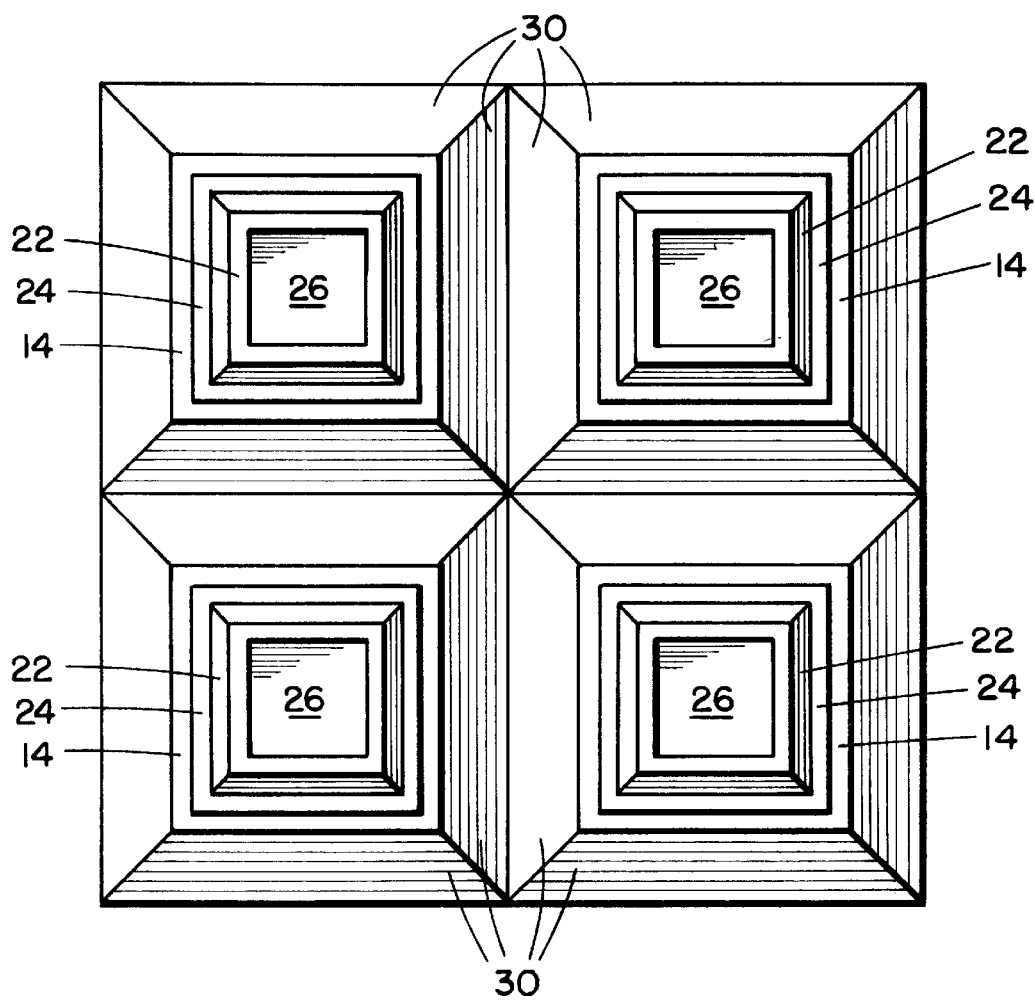
FIG. 4 is an enlarged top view an array of photodiodes that are constructed in accordance with the fabrication process of this invention.

FIG. 4 is a top view of a portion of the array prior to the application of the bumps 32. As can be seen, the fabrication process in effect provides a reduced area, radiation-responsive mesa structure that sits atop a larger supporting -mesa structure, which also serves to concentrate incident IR radiation flux into the radiation-responsive mesa structure.

Figure 5:
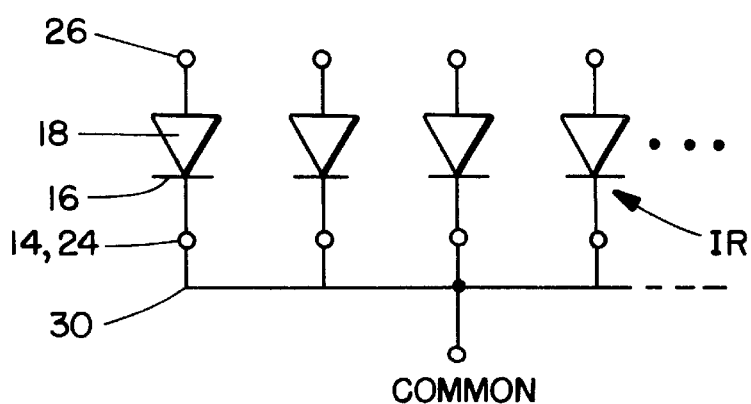
FIG. 5 is a schematic diagram of the array of photodetectors.

FIG. 5 is a schematic diagram depicting four photodetectors of the array fabricated in accordance with the teachings of this invention.

The use of the metalization layer 30 provides the additional benefit that IR radiation entering the device at angles of incidence below the criteria for total internal reflection (Bragg limit) will also be reflected and ultimately absorbed in the radiation absorbing layer 16.

As is described in the above-referenced U.S. Pat. No. 5,721,429, the disclosure of which is incorporated by reference herein in its entirety, the use of internal mesa reflection can provide, by example, a factor of 15 reduction in the volume of radiation absorbing material, as compared to conventional mesa-type photodetectors. This reduction in the volume in the radiation absorbing material translates to a significant reduction in the volume of the thermal noise generating material of the photodetector, and also in a significant reduction in the capacitance associated with the photodetector, such as p-n junction capacitance.

The substrate 12 is preferably an electrically insulating semiconductor material that is substantially transparent at the wavelengths of light that are desired to be absorbed within the layer 16. CdTe, CdZnTe and CdTeSe are suitable substrate materials for constructing photodetectors that are responsive to IR-radiation. The layers 14, 16 and 18 are preferably comprised of $Hg_{(1-x)}Cd_xTe$. In the radiation absorbing layer 16 the value of x is selected in a well-known manner as a function of the band of IR wavelengths to be detected. The value of x in the buffer layer 14 is relatively high so as to provide this layer as an electrically conductive layer, as well as to make the bandgap wider than that of the radiation absorbing layer 16. A wider bandgap for the buffer layer 14 also serves to minimize surface recombination states. The passivation layer 22 may be comprised of wider bandgap CdTe or another suitable material.

General information regarding IR-responsive materials may be found in an article entitled "HgCdTe and Related Alloys", D. Long and J. L. Schmit, Semiconductors and Semimetals, Vol. 5, IR Detectors, Academic Press 1970. An article entitled "Some Properties of Photovoltaic $Cd_xHg_{1-x}Te$ Detectors for Infrared Radiation", by J. M. Pawlikowski and P. Becla, Infrared Physics, Vol. 15 (1975) pp. 331–337 describes photovoltaic p-n junction detectors constructed of HgCdTe crystals and epitaxial films. The authors report that the position of a photosensitivity maximum is shifted within a spectral region of 1–9 microns by changing the molar fraction of cadmium.

While the invention has been particularly shown and described with respect to preferred embodiments thereof, it will be understood by those skilled in the art that changes in form and details may be made therein without departing from the scope and spirit of the invention.

What is claimed is:

1. A method for fabricating an array of electromagnetic radiation responsive photodiodes, comprising the steps of:

providing a substrate that is substantially transparent to wavelengths within a range of wavelengths of interest;

growing a plurality of layers upon a first surface of the substrate that is opposite to a second, radiation receiving surface of the substrate, the plurality of layers including an electrically conductive buffer layer, a radiation absorbing layer having a first type of conductivity, and a cap layer having a second type of conductivity opposite the conductivity of the radiation absorbing layer for forming a p-n junction therewith;

etching a plurality of first orthogonally disposed trenches through the cap layer, through the radiation absorbing layer, and partially through the buffer layer for differentiating the radiation absorbing layer and the cap layer into a plurality of initial mesa structures each having a base, a top surface, and sloping sidewalls that extend from the top surface to the base that terminates in the buffer layer;

forming a passivating layer on the sloping side walls;

forming an electrical contact that surrounds the base of each of the initial mesa structures, the electrical contact partially overlapping the passivating layer and forming an ohmic contact with a surrounding portion of the buffer layer;

etching a plurality of second orthogonally disposed trenches through exposed portions of the buffer layer and into the substrate for electrically isolating each of the initial mesa structures one from the other, the second orthogonally disposed trenches delineating a plurality of larger mesa structures individual ones of which support one of the initial mesa structures; and applying a common layer of metalization to exposed surfaces of the second orthogonally disposed trenches, the common layer of metalization being conductively coupled to each of the electrical contacts that surround the base of each of the initial mesa structures.

2. A method as in claim 1, wherein the step of etching the plurality of second orthogonally disposed trenches is accomplished using a reactive ion etch.

3. A method as in claim 1, wherein the step of etching the plurality of first orthogonally disposed trenches is accomplished using a wet chemical etch.

4. A method as in claim 1, wherein each of the larger mesa structures has sloping side walls disposed at an angle for supporting internal reflection of electromagnetic radiation that is incident on the radiation receiving surface of the substrate.

5. A method as in claim 1, wherein a bandgap of the buffer layer is wider than a bandgap of the radiation absorbing layer.

6. A method as in claim 1, wherein the buffer layer, the radiation absorbing layer, and the cap layer are each comprised of a Group II-VI alloy semiconductor material.

7. A method as in claim 1, wherein the initial mesa structures are disposed with a center to center spacing of x microns one from the other, and wherein a depth of the second trenches is approximately 0.65x microns.

8. A method as in claim 1, wherein side walls of the larger mesa structures are inclined with an angle of about 20 degrees referenced to a surface of the buffer layer.

9. An array of electromagnetic radiation responsive photodiodes, comprising:

a substrate that is substantially transparent to wavelengths within a range of wavelengths of interest;

a plurality of layers disposed over a first surface of said substrate that is opposite to a second, radiation receiving surface of said substrate, said plurality of layers comprising an electrically conductive buffer layer, a radiation absorbing layer having a first type of conductivity, and a cap layer having a second type of conductivity opposite the conductivity of said radiation absorbing layer for forming a p-n junction therewith, said cap layer and said radiation absorbing layer being differentiated into a plurality of first mesa structures each having a base, a top surface, and sloping sidewalls that extend from said top surface to said base and terminating in said buffer layer;

a passivating layer disposed on said sloping side walls;

an electrical contact surrounding said base of each of said first mesa structures, said electrical contact partially overlapping said passivating layer and forming an ohmic contact with a surrounding portion of said buffer layer;

a plurality of second mesa structures an individual one of which support one of said first mesa structures, said second mesa structures having sloping side walls that extend through said buffer layer and into said substrate for electrically isolating each of said first mesa structures one from the other; and a common layer of metalization disposed over said sloping sidewalls of said second mesa structures, said common layer of metalization being conductively coupled to each of said electrical contacts that surround the base of each of the first mesa structures.

10. An array of electromagnetic radiation responsive photodiodes as in claim 9, wherein said side walls of each of second mesa structures are disposed at an angle for supporting internal reflection of electromagnetic radiation that is incident on the radiation receiving surface of said substrate.

11. An array of electromagnetic radiation responsive photodiodes as in claim 9, wherein a bandgap of said buffer layer is wider than a bandgap of said radiation absorbing layer.

12. An array of electromagnetic radiation responsive photodiodes as in claim 9, wherein said buffer layer, said radiation absorbing layer, and said cap layer are each comprised of a Group II-VI alloy semiconductor material.

13. An array of electromagnetic radiation responsive photodiodes as in claim 9, wherein said first mesa structures are disposed with a center to center spacing of x microns one from the other, and wherein said sloping side walls of said second mesa structures are defined by trenches having a depth of approximately 0.65x microns.

14. An array of electromagnetic radiation responsive photodiodes as in claim 9, wherein side walls of said second mesa structures are inclined with an angle of about 20 degrees referenced to a surface of said buffer layer.

15. A method for fabricating an array of infrared (IR) radiation responsive photovoltaic devices, comprising the steps of:

providing a substrate that is substantially transparent to wavelengths within a range of IR wavelengths of interest;

growing a plurality of epitaxial Group II-VI alloy layers upon a first surface of the substrate that is opposite to a second, IR radiation receiving surface of the substrate, the plurality of layers including an electrically conductive buffer layer, an n-type layer having a bandgap selected for absorbing IR radiation within the range of IR wavelengths of interest, and a p-type cap layer for forming a p-n junction with the n-type radiation responsive layer, a bandgap of the buffer layer being wider than a bandgap of the n-type radiation absorbing layer;

wet chemical etching a plurality of first orthogonally disposed trenches through the cap layer, through the radiation absorbing layer, and partially through the buffer layer for differentiating the radiation absorbing layer and the cap layer into a plurality of initial mesa structures each having a base, a top surface, and sloping sidewalls that extend from the top surface to the base that terminates in the buffer layer;

forming a passivating layer on the sloping side walls;

depositing an electrical contact that surrounds the base of each of the initial mesa structures, the electrical contact forming an ohmic contact with a surrounding portion of the buffer layer;

reactive ion etching a plurality of second orthogonally disposed trenches through exposed portions of the buffer layer and into the substrate for electrically isolating each of the initial mesa structures one from the other, the second orthogonally disposed trenches delineating a plurality of larger mesa structures individual ones of which support one of the initial mesa structures and having sloping side walls disposed at an angle for supporting internal reflection of IR radiation that is incident on the radiation receiving surface of the substrate; and depositing a common layer of metalization to exposed surfaces of the second orthogonally disposed trenches, the common layer of metalization being conductively coupled to each of the electrical contacts that surround the base of each of the initial mesa structures.

16. A method as in claim 15, wherein the initial mesa structures are disposed with a center to center spacing of x microns one from the other, and wherein a depth of the second trenches is approximately 0.65x microns.

17. A method as in claim 15, wherein the side walls of the larger mesa structures are inclined with an angle of about 20 degrees referenced to a surface of the buffer layer.

* * * * *